United States Patent
Huang et al.

(10) Patent No.: US 9,866,229 B2
(45) Date of Patent: Jan. 9, 2018

(54) POWER ADAPTER AND CONTROL METHOD THEREOF

(71) Applicant: ASUSTeK COMPUTER INC., Taipei (TW)

(72) Inventors: Yi-Ming Huang, Taipei (TW); Wei-Chen Tu, Taipei (TW); Ming-Ting Tsai, Taipei (TW); Hsiang-Jue Hung, Taipei (TW); Shang-Yu Hung, Taipei (TW); Hung-Po Chen, Taipei (TW); Tzu-Nan Cheng, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 0 days.

(21) Appl. No.: 15/226,908

(22) Filed: Aug. 2, 2016

(65) Prior Publication Data

US 2017/0047852 A1 Feb. 16, 2017

(30) Foreign Application Priority Data

Aug. 13, 2015 (TW) .............................. 104126410 A

(51) Int. Cl.
*H02M 1/08* (2006.01)
*H03M 1/12* (2006.01)
*H02J 7/00* (2006.01)
*H02M 3/00* (2006.01)

(52) U.S. Cl.
CPC ................. *H03M 1/12* (2013.01); *H02J 7/00* (2013.01); *H02M 3/00* (2013.01)

(58) Field of Classification Search
CPC ........... H02M 1/00; H02M 2001/0003; H02M 2001/0025; H02M 1/08
USPC ............................................... 363/95, 97, 98
See application file for complete search history.

(56) References Cited

U.S. PATENT DOCUMENTS

| 8,949,631 | B2 | 2/2015 | Chen |
| 9,280,192 | B2* | 3/2016 | Hsu ........................... G06F 1/28 |
| 2006/0043947 | A1* | 3/2006 | Clavette ................ H02M 3/158 323/282 |
| 2009/0001937 | A1 | 1/2009 | Densham et al. |
| 2011/0057605 | A1 | 3/2011 | Chung et al. |
| 2012/0038342 | A1* | 2/2012 | Warren ................... H02M 1/00 323/293 |
| 2012/0062182 | A1 | 3/2012 | Rimdzius et al. |
| 2014/0195065 | A1 | 7/2014 | Yang |

(Continued)

FOREIGN PATENT DOCUMENTS

| CN | 102013705 A | 4/2011 |
| CN | 102957193 A | 3/2013 |

(Continued)

*Primary Examiner* — Jeffrey Sterrett
(74) *Attorney, Agent, or Firm* — CKC & Partners Co., Ltd.

(57) ABSTRACT

A power adapter includes a power converting circuit, a connecting terminal and a controller. The power converting circuit is used to convert an input voltage to an output voltage according to a control signal. The connecting terminal is connected to an electronic device to allow the output voltage outputted by the power converting circuit to charge the electronic device. The controller receives an identifying command from the electronic device when the electronic device is connected to the connecting terminal, and outputs the control signal according to the identifying command.

14 Claims, 5 Drawing Sheets

(56) References Cited

U.S. PATENT DOCUMENTS

2016/0161568 A1* 6/2016 Sawyers ................ G01R 31/40
                                                                              307/650
2017/0047852 A1* 2/2017 Huang ...................... H02J 7/00

FOREIGN PATENT DOCUMENTS

| CN | 103019352 A | 4/2013 |
| CN | 103762849 A | 4/2014 |
| TW | 201008077 A | 2/2010 |

* cited by examiner

POWER ADAPTER AND CONTROL METHOD THEREOF

CROSS-REFERENCE TO RELATED APPLICATION

This application claims the priority benefit of Taiwan application serial No. 104126410, filed on Aug. 13, 2015. The entirety of the above-mentioned patent application is hereby incorporated by reference herein and made a part of specification.

BACKGROUND OF THE INVENTION

Field of the Invention

The disclosure relates to a power adapter, particularly, to a power adapter applied to various charging architectures.

Description of the Related Art

Recently, the battery capacity for electronic devices such as phones, tablet computers, is continually increased to meet the improved requirement on the power consumption to extend the operating time of the electronic devices. However, the charging time for the battery with large battery capacity is also increased.

Quick charging architectures for various electronic devices are usually different; consequently, one adapter cannot support electronic devices with various quick charging architectures. As a result, different adapters should be configured for different electronic devices, which is rather inconvenience it use.

BRIEF SUMMARY OF THE INVENTION

A power adapter includes a power converting circuit, a connecting terminal and a controller. The power converting circuit is used to convert an input voltage to an output voltage according to a control signal. The connecting terminal is connected to an electronic device to allow the output voltage outputted by the power converting circuit to charge the electronic device. The controller receives an identifying command from the electronic device when the electronic device is connected to the connecting terminal, and outputs the control signal according to the identifying command.

A control method applied to an power adapter includes the following steps: receiving an identifying command output from the electronic device; determining a charging mode matching the electronic device according, to the identifying command; and outputting a corresponding control signal according to the charging mode to control the power converting circuit to output an output voltage to charge the electronic device.

From the above, the disclosure determines the charging mode electronic device by detecting the identifying command, and outputs the corresponding control signal to make the power adapter can simultaneously be applied to the electronic devices using different quick charging architectures, and provide output voltage and output current matching the electronic device to charge the electronic device, which improves the loss and inconvenience of the prior art.

DETAILED DESCRIPTION OF THE EMBODIMENTS

These and other features, aspects, and advantages of the present disclosure will become better understood with regard to the following description, appended claims, and accompanying drawings. Persons having ordinary skill in the art may make various modifications and changes without departing from the scope and spirit of the disclosure.

The terms "connected" or "coupled" represents that "electrically connected" or "electrically coupled", and the terms "connected" or "coupled" represents that two or more components operate or act with each other, which is not limited herein. "The first", "the second" and so on, except expressly stated, are not used to limit in the order in the disclosure, and they are only used to distinguish components or operations with same terms.

Figure 1:
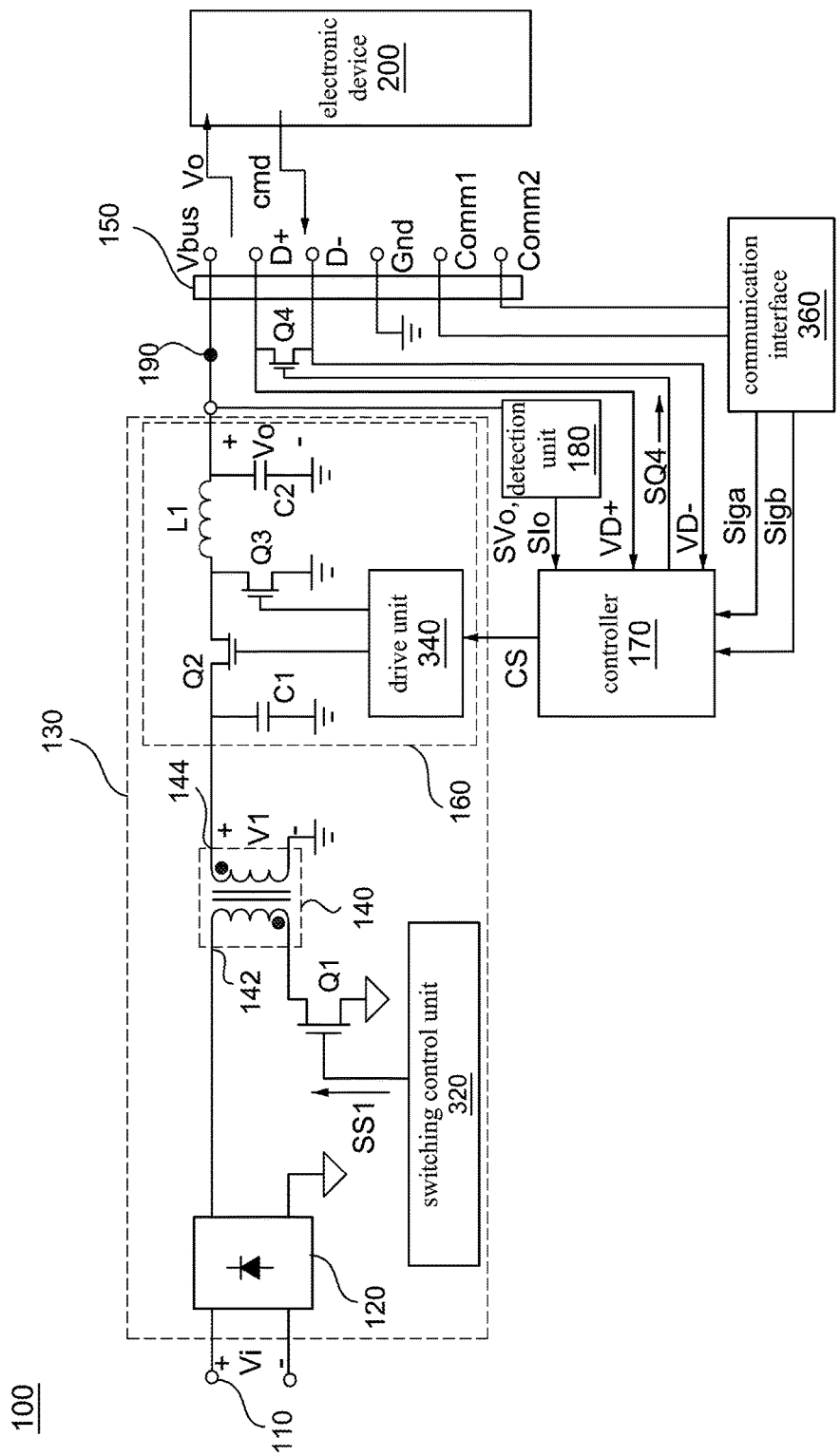
FIG. 1 is a schematic diagram showing a power adapter in an embodiment.

Refer to FIG. 1. FIG. 1 is a schematic diagram showing a power adapter 100 in an embodiment. As shown in FIG. 1, the power adapter 100 provides an output voltage Vo and a output current Io to charge the electronic device 200. In embodiments, the electronic device 200 is a personal computer, a notebook computer, a tablet computer, or a mart phone, which is not limited herein.

As shown in FIG. 1, the power adapter 100 includes a power converting circuit 130, a connecting terminal 150 and a controller 170. The power converting circuit 130 is coupled to an input terminal 110 and an output terminal 190, and receives an input voltage Vi from the input terminal 110, and then converts the input voltage Vi to an output voltage Vo according to a control signal CS, the output voltage Vo is output to the output terminal 190. The connecting terminal 150 is coupled to the output terminal 190 to connect to an interface of the electronic device 200. In an embodiment, the connecting terminal 150 is a Universal Serial Bus (USB) interface allowing the output voltage Vo and the output current Io to charge the electronic device 200 via the Universal Serial Bus interface.

The controller 170 is coupled to the power converting circuit 130 and the connecting terminal 150. When the electronic device 200 is connected to the connecting terminal 150 for charge, the controller 170 communicates with the electronic device 200 via the connecting terminal 150, receives an identifying command cmd from the electronic device 200, and outputs the control signal CS according to the identifying command cmd to control the power converting circuit 130 to operate in a charging mode matching the electronic device 200 and to output a proper output voltage Vo and an output current Io. Thus, the power adapter 100 can determine the type of the electronic device 200 and charging mode that supported by the electronic device 200 according to different identifying commands cmd, and further adjust the output voltage Vo and the output current Io correspondingly.

As shown in FIG. 1, in an embodiment, the power converting circuit 130 includes a rectifying unit 120, a transformer 140 and a converting unit 160. The rectifying unit 120 is coupled to the input terminal 110 to rectify the input voltage Vi.

Since the turn ratio of the primary winding and the secondary winding of the transformer 140 is n:1, after the first side 142 of the transformer 140 receives the rectified input voltage Vi, the second side 144 of the transformer 140 outputs the reduced first voltage V1. The converting unit 160 is coupled to the transformer 140 and the controller 170 to receive the first voltage V1, and adjusts the output voltage Vo and outputs the output current Io to the output terminal 190 according to the control signal CS output from the controller 170.

In an embodiment, the power adapter 100 includes a detection unit 180. The detection unit 180 is coupled to the output terminal 190 and the controller 170 to detect the output voltage Vo and the output current Io, and outputs corresponding output voltage detecting signal SVo and current detecting signal SIo to the controller 170 respectively. The controller 170 receives the output voltage detecting signal SVo and the output current detecting signal SIo to output the control signal CS according to the received output voltage detecting signal SVo and the received output current detecting signal SIo.

The following paragraphs will present several embodiments to achieve the function and operation of above power adapter 100. For detailed description, in the embodiments, the connecting terminal 150 is a universal serial bus interface.

In an embodiment, the power converting circuit 130 includes a switching unit Q1. A first end of the switching unit Q1 is coupled to the first side 142 of the transformer 140, a second end of the switching unit Q1 is coupled to the ground, and a control end is coupled to a switching control unit 320. The switching unit Q1 is turned on or turned off selectively according to a switching signal SS1 from the switching control unit 320. When the switching unit Q1 is turned on, current flows through the first side 142 of the transformer 140 and the power is stored in the transformer 140. When the switching unit Q1 is turned off, the power stored in the transformer 140 is outputted to a capacitor C1 and the back-end converting unit 160 via the second side 144. After the operation of the switching unit Q1 and the transformer 140, the second side 144 outputs the reduced first voltage V1.

The converting unit 160 may be various kinds of convertors for different embodiments. In an embodiment, as shown in FIG. 1, the converting unit 160 is a buck converter composed of capacitors C1, C2, the switching units Q2, Q3 and an inductor L1, which is not limited herein.

The buck converter 160 provides current flowing through the inductor L1 to charge the capacitor C2 when the switching unit Q2 is turned on while the switching unit Q3 is turned off. When the switching unit Q2 is turned off while the switching unit Q3 is turned on, the power stored in the capacitor C2 is provide to the back-end circuit via the switching unit Q3 and the inductor L1. Thus, the ratio between the input voltage and the output voltage can be controlled by adjusting the turn-on time of the switching element Q2 to adjust the output voltage Vo from the converting unit 160.

The controller 170 can output corresponding control signal CS (such as pulse width modulated signal) according to the identifying command cmd to the drive unit 340, and the drive unit 340 output a switch signal to turn on or turn off of the switching units Q2, Q3, thus, the output voltage Vo and the output current to output from the converting unit 160 can be adjusted according to the control signal CS, which makes the converting unit 160 operate in a proper charging mode.

As shown in FIG. 1, the universal serial bus interface as the connecting terminal 150 includes a power supply pin Vbus, a signal pin D+, a signal pin D−, a ground pin Gnd, signal pins Comm 1 and Comm 2. In embodiments, the controller 170 receives the identifying command cmd via the universal serial bus interface in various forms.

In an embodiment, the identifying command crud is the current waveform feature of the output current Iout. The controller 170 receives the current waveform feature of the output current Iout according to the output voltage detecting signal SVo and the output current detecting signal SIo output from the detection unit 180 and determines the charging mode for the electronic device 200.

In an embodiment, the electronic device 200 changes the value of the output current to by controlling the received power after receiving the preset output voltage Vo (such as 5V). In an embodiment, the electronic device controls the output current Io to switch between 1 A and 0.5 A every 2 ms or every 1 ms as a cycle. In other words, the electronic device 200 can change the current waveform feature of the output current Io to send the identifying command and to the power adapter 100. When the output current detecting signal SIo received by the controller 170 matches a specific current waveform feature (such as: the output current Iout is switched between 1 A and 0.5 A every 2 ms as a cycle), the controller 170 determines the charging mode matching the electronic device 200 according to different current waveform features.

In another embodiment, the controller 170 controls to turn on or turn off of the switching unit Q4 via an operating signal SQ4 of a General Purpose I/O and detects the voltage change at the signal pin D+ and the signal pin D− of the connecting terminal 150. The voltage command VD+, VD− output via the signal line on the universal serial bus interface is used as the identifying command cmd.

In an embodiment, when the power adapter 100 is connected to the electronic device 200 via the connecting terminal 150, the signal SQ4 controls the switching unit Q4 to form a short circuit between the signal pin D+ and the signal pin D−, and the electronic device 200 detects that the power adapter 100 is in a dedicated charging port mode. At this moment, the output voltage Vo is at a preset value (such as 5V). If the electronic device 200 support a charging mode in different voltage levels, the electronic device 200 can load the voltage command VD+ at the signal pin D+. When the voltage command VD+ lasts for a while, the power adapter 100 makes the short circuit between the signal pin D+ and the signal pin and then the voltage command VD− on the signal pin D− decrease. Then the electronic device 200 sets different voltage commands VD+ as the identifying command and to make the power adapter 100 output a corresponding output voltage Vo according to the identifying command cmd.

In an embodiment, when the voltage command VD+ of the signal pin D+ is 3.3V, and the voltage command VD− of the signal pin D− is 0.6V, the power adapter 100 outputs the output voltage Vo of 9V correspondingly. When the voltage command VD+ of the signal pin D+ is 0.6V, and the voltage command VD− of the signal pin D− is 0.6V, the power adapter 100 outputs the output voltage Vo of 12V correspondingly.

In an embodiment, the power adapter 100 further includes a communication interface 360 coupled between the connecting terminal 150 and the controller 170. The controller 170 receives the identifying command and via the communication interface 360. In embodiments, the communication interface 360 is a universal asynchronous receiver/transmitter (UART) interface, an inter-integrated circuit (I²C) interface, which is not limited herein. The identifying command cmd is transmitted to the communication interface 360 via the signal pins Comm1 and Comm2, and then converted to a signal format such as: signal SigaSigtb) readable by the controller 170 via the communication interface 360.

Figure 2:
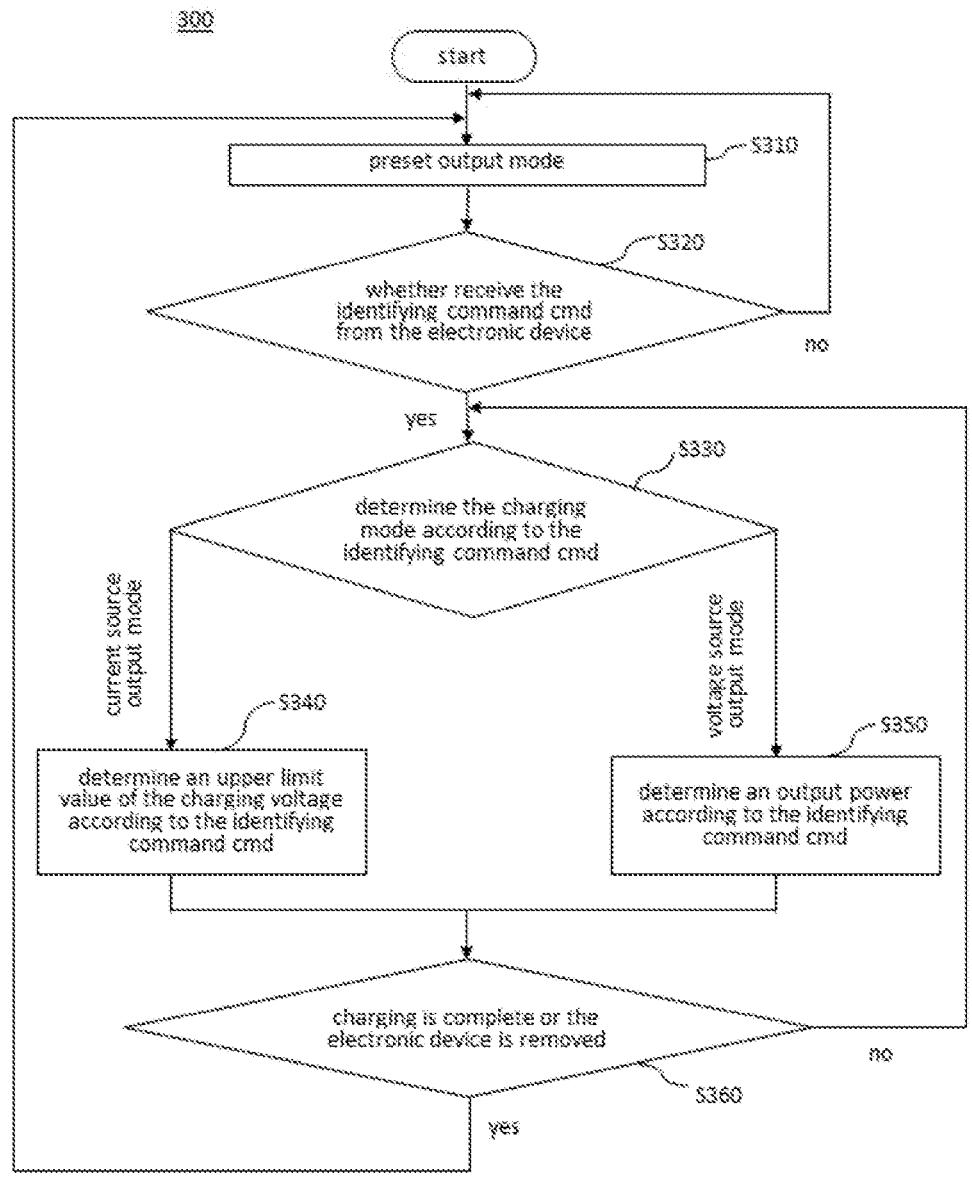
FIG. 2 is a flow diagram showing a control method in an embodiment.

Refer to FIG. 2, FIG. 2 is a flow diagram showing a control method 300 in an embodiment. The operation of the power adapter 100 is introduced with the control method 300 together. In the embodiment, the connecting terminal 150 is an universal serial bus interface, which is not limited herein.

The control method 300 includes step S310 to step S360, in the step S310, before the identifying command cmd is received from the electronic device 200, the power adapter 100 charges the electronic device 200 according to a preset output mode. In an embodiment, in the preset output mode, the control signal CS controls the power converting circuit 130 to output the output voltage Vo of 5V and the maximum output current Io is 2 A.

In the step S320, the controller 170 receives the identifying command cmd from the electronic device 200. When the electronic device 200 does not transmit the identifying command cmd to the controller 170 or the controller 170 cannot recognize the identifying command cmd from the electronic device 200, return to the step S310, the controller 170 controls the power adapter 100 to charge the electronic device 200 according to a preset output mode.

When the controller 170 receives the identifying command cmd from the electronic device 200, go to step S330, the controller 170 determines a charging mode matching the electronic device 200 according to the identifying command cmd. In embodiments, the electronic device 200 may operate at a voltage source output mode (a boost charging mode) or a current source output mode according to different architectures of the electronic device 200. The controller 170 determines whether the power converting circuit 130 is operated at a voltage source output mode or a current source output mode according to the identifying command cmd.

When the identifying command cmd indicates that the electronic device 20 matches the current source output mode, first, the electronic device is quickly charged by a constant current (CC). In this step, the controller 170 outputs the control signal CS to make the power converting circuit 130 maintain a constant output current Io to charge the electronic device 200. The controller 170 determines the battery type of the electronic device 200 according to the identifying command mid and determines the output current Io.

In an embodiment, the output current Io maintains at 2 A. In the charging procedure, since the output current to maintains at 2 A, with the boost of the battery voltage of the electronic device 200, the output voltage Vo gradually increases until the output voltage Vo reaches to an upper limit value of the charging voltage of the battery of the electronic device 200. For example, an upper limit value of the charging voltage is 4.2V or 4.35V for different batteries in embodiments. In the step S340, the controller 170 determines the battery type of the electronic device 200 according to the identifying command cmd, and determines an upper limit value of the charging voltage. When the output voltage Vo of the power converting circuit 130 reaches the upper limit value of the charging voltage (such as 4.25V), the control signal CS controls the power converting circuit 130 to convert to the constant voltage (CV) charging. At this moment, the power convening circuit 130 maintains the output voltage Vo at the upper limit value of the charging voltage (such as 4.25V), and the output current Io gradually decreases with approach to the charging saturation until the battery charge of the electronic device 200 is completed.

On the other hand, when the identifying command cmd indicates that the electronic device 200 is adapted to operate at the voltage source output mode, the boost charging mode is executed. In this mode, the controller 170 outputs the control signal CS to boost the output voltage Vo and to charge the electronic device 200 fast. In the step S350, the controller 170 gets the output power receivable by the electronic device 200 according to the identifying command cmd, and the controller 170 outputs a corresponding control signal CS to control the output voltage Vo of the power converting circuit 130. For example, when the controller 170 determines that the electronic device 200 is a mobile phone according to the identifying command cmd, the matching mode is that the output voltage Vo is 9V and the maximum output current to is 2 A, then, the controller 170 outputs the corresponding control signal CS to control the output voltage Vo and the output current Io of the power converting circuit 130. Similarly, if the electronic device 200 is a tablet computer, the matching charging mode is that the output voltage Vo is 15V and the maximum output current Io is 2 A. If the electronic device 200 is a notebook, the matching charging mode is that the output voltage Vo is 19V and the maximum output current Io is 2 A.

In other words, no matter the controller 170 determines the charging mode matching the electronic device 200 is the current source output mode in the step S340 or the voltage source output mode in step S350 (the boost charging mode) according to the identifying command cmd, the controller 170 outputs a corresponding control signal CS according to the charging mode of electronic device 200 to control the output voltage Vo and the output current Io of the power converting circuit 130 to charge the electronic device 200.

In addition, the controller 170 detects the output voltage Vo and the output current Io from the power converting circuit 130 according to the output voltage detecting signal SVo and output current detecting signal SIo output from the detection unit 180, and outputs the control signal CS according to the output voltage Vo and the output current Io to ensure the output voltage Vo and the output current to not exceeding the upper limited value.

In the step S360, the controller 170 determines whether the charging is completed or not, or whether the electronic device 200 is disconnected with the connecting terminal 150. When the electronic device 200 is disconnected, the charging is finished or any other unexpected error is occurred, return to the preset charging mode in step S310. Otherwise, the controller 170 repeats the steps S330-S360 and determines the charging request of the electronic device 200 according to the identifying command cmd and adjusts the control signal CS to control the power converting circuit 130.

The steps in the above embodiment is just an example, the sequence of the steps in the embodiment can be adjusted according to requirements or even simultaneously or partially simultaneously executed, except expressly stated. Persons having ordinary skill in the art can understand how the control method 300 operates with the power adapter 100 in FIG. 1, which is not limited herein.

Figure 3:
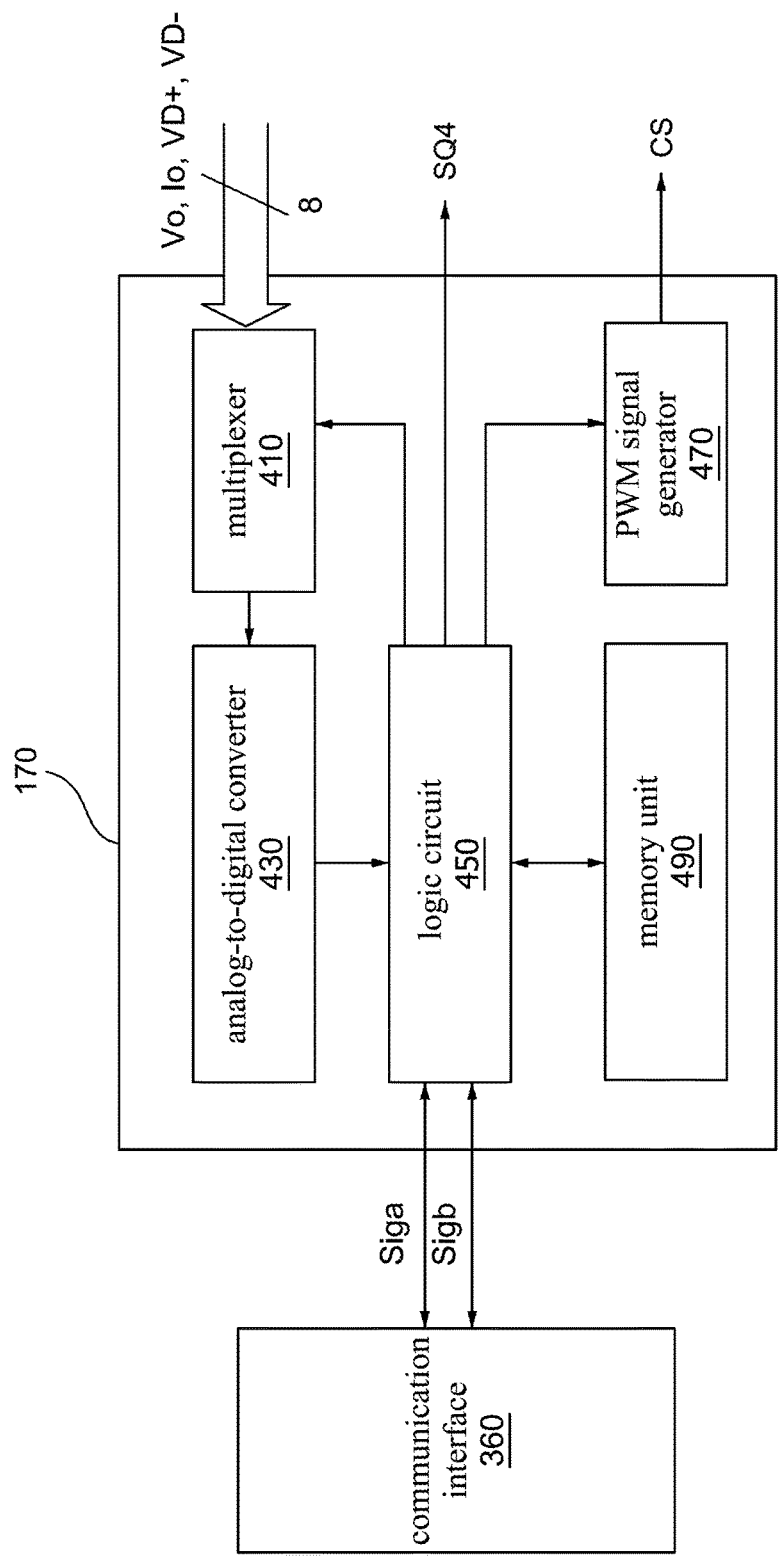
FIG. 3 is a schematic diagram showing an controller in an embodiment.

Please refer to FIG. 3, FIG. 3 is a schematic diagram showing an controller 170 according to an embodiment. Please refer to the power adapter 100 in FIG. 1 together. As shown in FIG. 3, the controller 170 is an integrated circuit chip. The integrated circuit chip includes a multiplexer 410, an analog-to-digital converter 430, a logic circuit 450, a PWM signal generator 470 and a memory unit 490. The memory unit 490 includes a read-only memory (ROM) and a random access memory (RAM) for the logic circuit 450 conducting the read and write operations when executes algorithms.

In operation, the controller 170 receives the output voltage detecting signal SVo, an output current detecting signal SIo and the voltage command VD+, VD− output from the signal pin D+ and the signal pin D− on the USB interface via the multiplexer 410. The logic circuit 450 selects a signal to transmit to the analog-to-digital converter 430, and the signal is converted to a digital signal for the logic circuit 450 to analyze the identifying command cmd, and the control method 300 is executed via algorithms as shown in FIG. 2. For example, in an embodiment, the voltage command VD+, VD− is used the identifying command cmd, the logic circuit 450 controls the switching unit Q4 to turn on via the operating signal SQ4 of the General Purpose I/O(GPIO). In another embodiment, the signal pin Comm1 and Comm2 output the identifying command cmd, the logic circuit 450 receives signals Siga, Sigb via the communication interface 360 to determine the identifying command cmd.

Thus, the logic circuit 450 receives and determines the identifying command cmd, and controls the PWM signal generator 470 to output a corresponding PWM signal as the control signal CS to achieve the operation of the controller 170.

Figure 4:
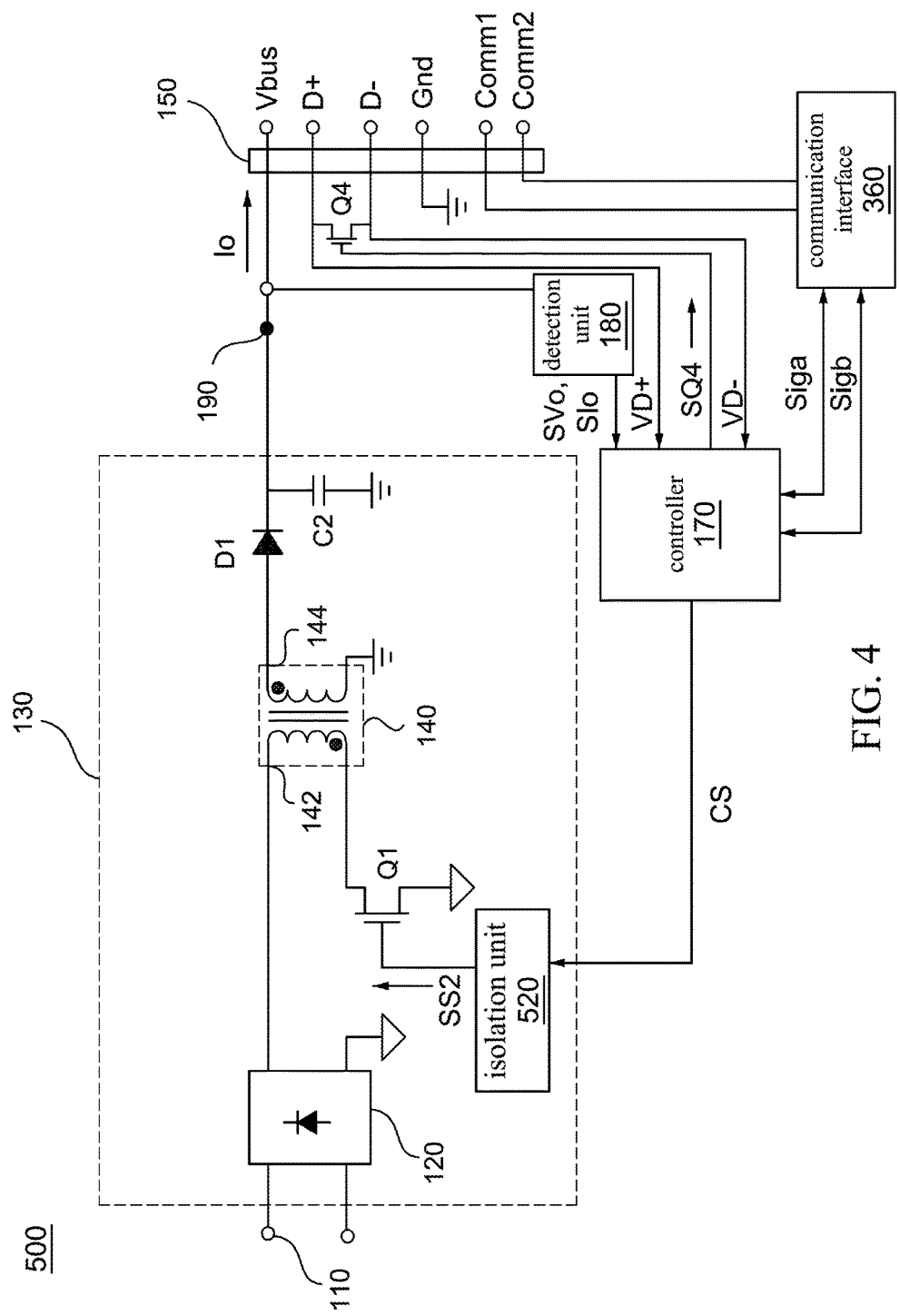
FIG. 4 is a schematic diagram showing a power adapter in an embodiment.

Refer to FIG. 4 FIG. 4 is a schematic diagram showing a power adapter 500 in an embodiment. The power converting circuit 130 includes a rectifying unit 120, an isolation unit 520, a switching unit Q1 and a transformer 140. The isolation unit 520 is coupled to the controller 170, the switching unit Q1 is coupled to the isolation unit 520, the first side 142 of the transformer 140 is coupled to the switching unit Q1, the second side 144 of the transformer 140 is coupled to the output terminal 190 via a diode D1.

The difference between the embodiment in FIG. 4 and the embodiment in FIG. 1 is that the power converting, circuit 130 is not coupled to the converter via the second side 144 of the transformer 140 to adjust the output voltage Vo in the power adapter 500. In the embodiment, the isolation unit 520 receives the control signal CS and outputs the corresponding switching signal SS2 to control the switching unit Q1. Thus, when voltage of the first side 142 of the transformer 140 is controlled at a target value, the second side 144 of the transformer 140 outputs the output voltage Vo correspondingly.

In an embodiment, the isolation unit. 520 is an optical coupler which transmits signals via an inner light-emitting, diode and a light sensor and isolates the high voltage side and the low voltage side of the transformer 140. Thus, the controller 170 outputs the corresponding control signal CS to adjust the working cycle of the switching signal 552 indirectly, and change the conduction time of the switching unit Q1 to control the voltage on the first side 142 of the transformer 140, thereby controls the output voltage Vo and the output current to of the power converting circuit 130.

Figure 5:
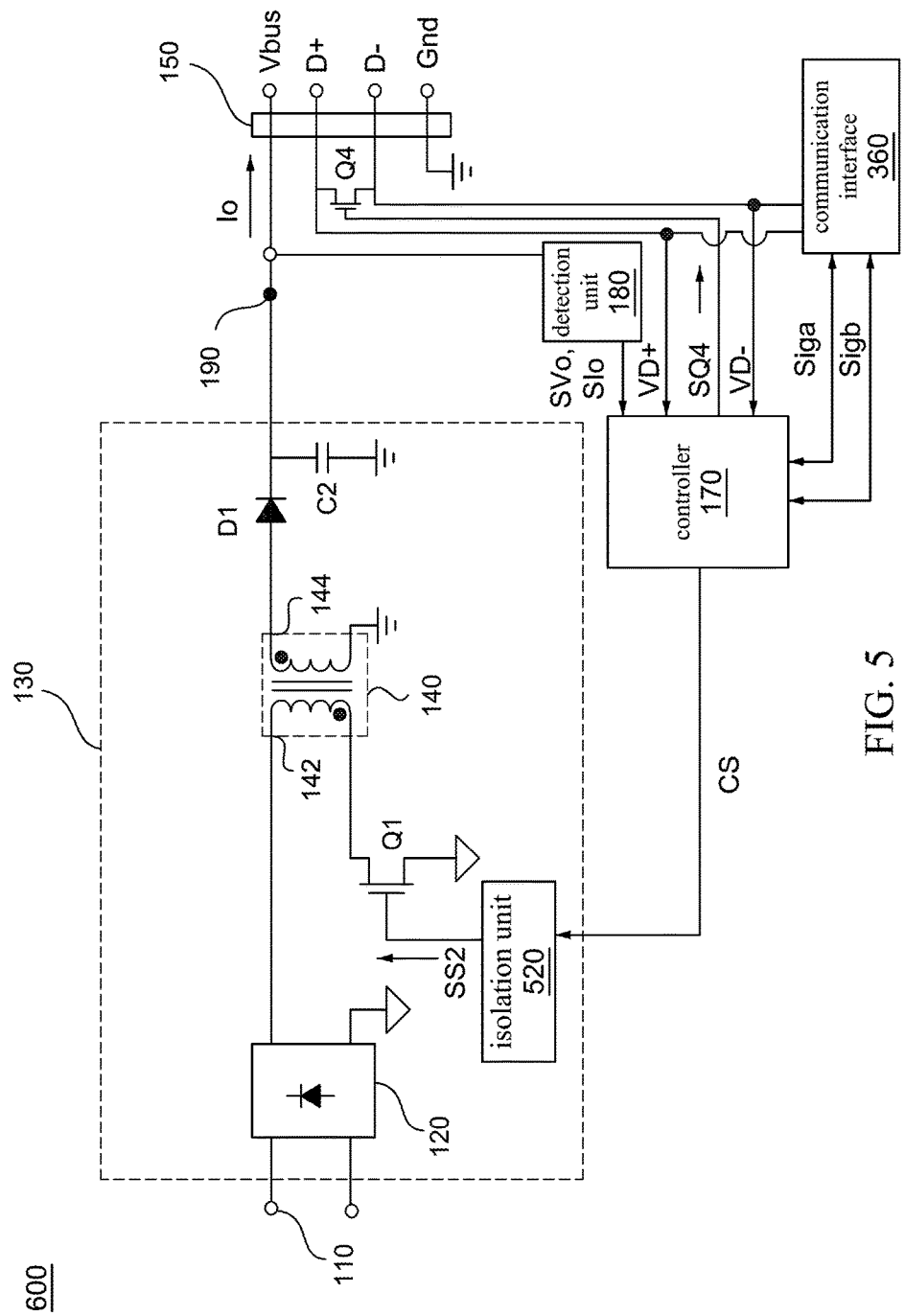
FIG. 5 is a schematic diagram showing a power adapter in an embodiment.

Please refer to FIG. 5, FIG. 5 is a schematic diagram showing a power adapter 600 in an embodiment. The communication interface 360 is coupled to the signal pin D+ and the signal pin D− on the USB interface. Thus, additional signal pins Comm1, Comm2 are not necessary for connection with the communication interface 360 to transmit the signal Siga, Sigb, which can save pins required by the connection terminal 150.

The components in the embodiments are kinds of digital or analog circuits, or different integrated circuit chips. The components are integrated to one integrated digital control chip, which is not limited herein. The implementation of each component can be selected according to practical requirements. For example, the switching units Q1-Q4 are Metal Oxide Semiconductor Field Effect Transistors (MOSFET), Bipolar Junction Transistors (BJT).

Although the present disclosure has been described in considerable detail with reference to certain preferred embodiments thereof, the disclosure is not for limning the scope. Persons having ordinary skill in the art may make various modifications and changes without departing from the scope. Therefore, the scope of the appended claims should not be limited to the description of the preferred embodiments described above.

What is claimed is:

1. A power adapter, comprising:
   a power converting circuit configured to convert an input voltage to an output voltage according to a control signal;
   a connecting terminal connected to an electronic device, configured to allow the output voltage outputted by the power converting circuit to charge the electronic device; and
   a controller configured to receive an identifying command sent by the electronic device when the electronic device is connected to the connecting terminal;
   wherein the controller further configured to determines a type of the electronic device and a charging mode that supported by the electronic device according to the identifying commands to adjust the output voltage and an output current correspondingly, and configured to determine a battery type of the electronic device according to the identifying command to determine the output current or an upper limit value of the charging voltage.

2. The power adapter according to claim 1, wherein the power converting circuit includes:
   a transformer including a first side and a second side, wherein the first side receives the input voltage and the second side outputs a first voltage;
   a converting unit coupled to the second side, configured to receive the first voltage and to output the output voltage according to the control signal; and
   a switching unit coupled to the first side, configured to control the voltage of the first side according to a switching signal.

3. The power adapter according to claim 1, further comprising:
   a detection unit coupled to the controller, configured to output a corresponding output voltage detecting signal and an output current detecting signal respectively according to the output voltage and an output current of the power converting circuit;
   wherein the controller is further configured to receive the output voltage detecting signal and the output current detecting signal, and to output the control signal according to the output voltage detecting signal and the output current detecting signal.

4. The power adapter according to claim 3, wherein the identifying command includes a current waveform feature of the output current.

5. The power adapter according to claim 1, further comprising:
   a communication interface coupled between the connecting terminal and the controller, wherein the controller is configured to receive the identifying command via the communication interface.

6. The power adapter according to claim 1, wherein the connecting terminal includes a universal serial bus interface, the identifying command includes a voltage command output via a signal line of the universal serial bus interface.

7. The power adapter according to claim 1, wherein the power converting circuit includes:
   an isolation unit configured to output a switching signal according to the control signal;
   a switching unit coupled to the isolation unit, and
   a transformer including a first side and a second side, wherein the first side is coupled to the switching unit to receive the input voltage;
   wherein the switching unit is configured to control the second side to output the output voltage according to the switching signal.

8. A control method, applied to a power adapter, wherein the power adapter includes a power converting circuit, a connecting terminal and a controller, the connecting terminal is configured to connect to an electronic device to allow the power converting circuit to charge the electronic device, the control method comprising:
   receiving an identifying command output from the electronic device;
   determining a charging mode matching the electronic device according to the identifying command;
   outputting a corresponding control signal according to the charging mode to control the power converting circuit to output an output voltage to charge the electronic device;
   determining a type of the electronic device and a charging mode that supported by the electronic device according to identifying commands to adjust the output voltage and an output current correspondingly by the controller; and
   determining a battery type of the electronic device according to the identifying command to determine the output current or an upper limit value of the charging voltage by the controller.

9. The control method according to claim 8, wherein the step of determining the charging mode matching the electronic device includes:
   determining the power converting circuit to operate in a voltage output mode or a current output mode according to the identifying command.

10. The control method according to claim 8, further comprising:
    detecting the output voltage and a output current of the power converting circuit; and
    outputting the control signal according to the charging mode, the output voltage and the output current.

11. A power adapter for charging an electronic device, the power adapter comprising:
    a power converting circuit having an output terminal, and configured to convert an input voltage into an output voltage, and to provide an output current, the power converting circuit outputting the output voltage and the output current through the output terminal;
    a connecting terminal electrically coupled to the power converting circuit to receive the output voltage therefrom, and electrically coupled to the electronic device to transmit the output voltage thereto for charging the electronic device;
    a detection unit electrically coupled to the output terminal of the power converting circuit, and configured to detect the output voltage and the output current, and output a corresponding output voltage detecting signal and a corresponding output current detecting signal; and
    a controller electrically coupled to the power converting circuit, the detection unit, and the connecting terminal, and configured to:
       in response to receiving an identifying command from the electronic device, determine a charging mode matching the electronic device according to the identifying command as either a current source output mode or a voltage source output mode;
       when the charging mode of the electronic device is the current source output mode, output the control signal to control the power converting circuit to maintain the output current at a constant current level; and
       when the charging mode of the electronic device is the voltage source output mode, output the control signal to control the power converting circuit to increase the output voltage;
    wherein when the charging mode of the electronic device is the current source output mode, the controller is further configured to:
    determine a battery type of a battery of the electronic device and an upper limit value of a charging voltage of the battery of the electronic device according to the identifying command;
    determine when the output voltage of the power converting circuit has reached the upper limit value of the charging voltage from the output voltage detecting signal; and
    output the control signal to control the power converting circuit to maintain the output voltage at the upper limit value;
    wherein the electronic device is external to the power converting circuit, the connecting terminal, the detection unit, and the controller of the power adapter and is electrically coupled directly to the connecting unit, and each of the power converting circuit, the controller, and the detection unit is electrically coupled directly to the connecting unit to be electrically coupled to the electronic device via the connecting unit.

12. The power adapter of claim 11, wherein the controller is further configured to:
    prior to receiving the identifying command from the electronic device, output a control signal to control the power converting circuit to operate in a preset output mode, wherein in the preset output mode, the power converting circuit outputs the output voltage and the output current respectively at predetermined levels;
    wherein the constant current level of the output current when the charging mode of the electronic device is the current source output mode is the same as the predetermined level of the output current when the power converting circuit operates in the preset output mode.

13. The power adapter of claim 12, wherein when the charging mode of the electronic device is the voltage source output mode, the controller is further configured to:
    determine an output power receivable by the electronic device according to the identifying command, wherein the output power includes a set voltage and a set current, and the set voltage is higher than the predetermined level of the output voltage in the preset output mode;
    output the control signal to control the power converting circuit to output the output voltage and the output current at the set voltage and the set current, respectively.

14. The power adapter of claim 13, wherein the controller is further configured to:
- determine when the output voltage of the power converting circuit has reached the set voltage from the output voltage detecting signal, and when the output current of the power converting circuit has reached the set current from the output current detecting signal; and
- output the control signal to control the power converting circuit to maintain the output voltage and the output current respectively at the set voltage and the set current.

\* \* \* \* \*